United States Patent
Wu et al.

[11] Patent Number: 6,052,808
[45] Date of Patent: Apr. 18, 2000

[54] MAINTENANCE REGISTERS WITH BOUNDARY SCAN INTERFACE

[75] Inventors: Shianling Wu, Lawrenceville, N.J.; Ramesh Karri, New York, N.Y.; Charles E. Stroud, Lexington, Ky.

[73] Assignees: University of Kentucky Research Foundation, Lexington, Ky.; Lucent Technologies Inc., Murray Hill, N.J.

[21] Appl. No.: 08/962,340

[22] Filed: Oct. 31, 1997

[51] Int. Cl.[7] .............................. G01R 31/28; H02H 3/05
[52] U.S. Cl. ........................... 714/727; 714/30; 714/703
[58] Field of Search .................................. 714/703, 726, 714/727, 729, 724, 725, 733, 736, 25, 27, 30; 364/266, 944.9

[56] References Cited

U.S. PATENT DOCUMENTS

| | | | |
|---|---|---|---|
| 5,404,358 | 4/1995 | Russell | 714/727 |
| 5,448,576 | 9/1995 | Russell | 714/727 |
| 5,574,733 | 11/1996 | Kim | 714/728 |
| 5,610,530 | 3/1997 | Whetsel | 324/763 |
| 5,621,739 | 4/1997 | Sine et al. | 714/724 |
| 5,659,552 | 8/1997 | Ke et al. | 714/727 |
| 5,774,477 | 6/1998 | Ke | 714/727 |

*Primary Examiner*—Trinh L. Tu
*Attorney, Agent, or Firm*—Darby & Darby

[57] ABSTRACT

Concurrent Fault Detector Circuits (CFDCs) are test components of a main system, e.g. an Application Specific Integrated Circuit, and provide the results of the tests in parallel to at least one Error Source Register (ESR). Instead of reading out the ESR in parallel, its contents are copied to a serial shadow register so the contents can be read out in series to an error correcting application, thus reducing the number of output pins and the burden on resources of the main system. The ESR's receipt and transfer of information is under the control of a Boundary Scan Interface. In one embodiment, the test results are prioritized and compared to data in a mask register so that only important errors create a system interrupt which causes the read out of data from the shadow register.

21 Claims, 2 Drawing Sheets

FIG. 2

DESIGN PARAMETERS:
    $N$:        Width of the ESR, MASK and DCR.
    CLK_EDGE:  If the generic value = 1
                then the ESR, MASK and DCR are triggered by the
                    rising clock edge of the system clock CLK
              else if the generic value = 0
                  then the ESR, MASK and DCR are triggered by
                      the falling edge of the CLK.

STEPS:
    Step 1:    Initiate an $N$ bit ESR triggered by the CLK according to the CLK_EDGE.
    Step 2:    Initiate an $N$ bit MASK triggered by the CLK according to the CLK_EDGE.
    Step 3:    Initiate an $N$ bit DCR triggered by the CLK according to the CLK_EDGE.
    Step 4:    Initiate a SRESR triggered by the rising edge of the test clock TCK.
    Step 5:    Initiate a SRMASK triggered by the rising edge of the test clock TCK.
    Step 6:    Initiate a SRDCR triggered by the rising edge of the test clock TCK.
    Step 7:    Initiate combinational logic to process the input signals, the SH, CPT and UP signals, as follows:
    Step 7A:   If the SH signal has a binary one value,
                 then begin
                      (1)    shift the SRESR [1] onto TDO
                               shift the SRMASK [1] onto TDO
                               shift the SRDCR [1] onto TDO
                      (2)    for $i = 1$ to $N-1$
                               shift SRESR[$i+1$] into SRESR[$i$]
                               shift SRMASK[$i+1$] into SRMASK[$i$]
                               shift SRDCR[$i+1$] into SRDCR[$i$]
                      (3)    shift TDI into SRESR[$N$]
                               shift TDI into SRMASK[$N$]
                               shift TDI into SRDCR[$N$]
                 end.
    Step 7B:   If the CPT signal has a binary one value,
                 then write the data bit vector in the ESR
                      into the SRESR
                 write the data bit vector in the MASK
                      into the SRMASK
                 write the data bit vector in the DCR
                      into the SRDCR.
    Step 7C:   If the UP signal has a binary one value,
                 then write the test data bit vector in the SRESR
                      into the ESR
                 write the test data bit vector in the SRMASK
                      into the MASK
                 write the test data bit vector in the SRDCR
                      into the DCR.

MAINTENANCE REGISTERS WITH BOUNDARY SCAN INTERFACE

FIELD OF THE INVENTION

This invention relates to maintenance registers which employ a standard Boundary Scan interface and, more particularly, to maintenance registers accessed by a Boundary Scan interface for interfacing between Concurrent Fault Detection Circuits (CFDCs), which are supported by the maintenance registers) and an Application Specific Integrated Circuit (ASIC) in which the CFDCs and the maintenance registers are implemented.

BACKGROUND OF THE INVENTION

CFDCs are important components for online testing in systems designed for high reliability, high availability, and/or systems designed to be testable so that a particular system component which is faulty can be replaced, such systems as ASICs, Printed Circuit Boards (PCBs) and digital systems such as electronic switching systems (such systems are hereinafter referred to as ASIC systems). CFDCs are typically incorporated into ASIC systems to test predetermined components of such systems for errors and to support the ASIC system's maintenance operations.

Since CFDCs identify errors in ASIC system components, there is a need for a systematic error reporting mechanism. Maintenance registers provide such a reporting mechanism. The primary maintenance register for supporting the CFDCs is an error source register (ESR) which latches and holds error data from the CFDCs. The error data indicates errors identified by the CFDCs for predetermined components in the ASIC system. Additional maintenance registers, namely a mask (MASK) register and a diagnostic control register (DCR), as well as interrupt circuits, namely an interrupt (INT) circuit with or without a priority encoded interrupt (PEINT) circuit, can be added to the ESR. These registers and circuits provide additional functionality in supporting the CFDCs. Namely, the MASK register and the interrupt circuits support the ESR in prioritizing the reporting of errors, and the DCR supports testing the CFDCs themselves to ensure that they are fault-free. Either the ESR alone, or in combination with any of the MASK, DCR or the INT circuit (with or without the PEINT circuit), is hereinafter referred to as the maintenance register assembly.

The functions performed by the ESR, MASK register and the interrupt circuits described above occur during online testing. "Online testing," performed by online testing devices (e.g., the CFDCs) during the main operations of the ASIC system, is the testing of components which perform the system's main operations. Online testing ensures that the components are fault-free. During online testing, the ASIC system components are tested by the CFDCs and the results of such testing are latched by the ESR. Also, either the ESR alone, or in combination with the MASK register and/or the interrupt circuits, reports errors to the maintenance application of the ASIC system. For online testing functions, the maintenance register assembly is controlled by the main operations of the ASIC system.

"Offline testing," performed in parallel with or independently of the main operations of the ASIC system, is the testing of components which perform functions separate from the system's main operations, e.g., testing of the CFDCs and maintenance register assembly. Offline testing ensures that such components are fault-free. This is in effect a second level of testing comprising testing the online testing devices themselves. In addition, the DCR operates during offline testing. For offline testing functions, the assembly is not controlled by the ASIC system's main operations. Rather it is controlled by a maintenance application, which can be part of the ASIC system, or another maintenance application outside the control of the ASIC system, e.g, Automatic Test Equipment application or a user driven application. During offline testing, the maintenance register assembly does not communicate directly with the maintenance application controlling it. Rather, historically, a traditional system interface has been used to connect the maintenance register assembly and the maintenance application.

However, there are several disadvantages of using the traditional system interface between the maintenance register assembly and the maintenance application. They are based on the contribution of the assembly to the area overhead of the ASIC system in which the assembly is implemented. Area overhead includes the physical (i.e., hardware) resources used for operations of the ASIC system as well as software resources. While the CFDC support functions provided by the assembly are essential to the ASIC system operation, the assembly can have a significant impact on such area overhead.

The traditional interface requires an input and an output pin for each bit of each maintenance register in order to access the data bits stored in each such register. For example, where the MASK register is a 20 bit wide register, 40 pins are needed on the maintenance register assembly (20 input and 20 output pins) to access the register's data. In addition, with a 20 bit wide MASK register, the ESR and DCR also contain 20 bits (since the functionality of the maintenance registers requires that the MASK register and the DCR have the same configuration, including bit width, as the ESR). Therefore, the number of pins on the assembly necessary to access the contents of the registers is 120. The necessity of two pins per bit for each maintenance register of the assembly incurs a significant area overhead penalty for the ASIC system. Also, ongoing developments for increasing the functionality of ASIC systems by adding system components further increases the bit width of the registers. This is because the bit width of the ESR equals the number of components which the CFDCs test. As a result, there is an ongoing need to add to the bit width of the maintenance registers in the assembly and, accordingly, further increase the overhead area penalty with the use of the traditional system interface.

Another disadvantage of using the traditional system interface is that in order to avoid the overhead penalty of two pins per bit for each maintenance register, multiple pins have been abandoned in favor of the traditional interface accessing solely the ESR or a reduced amount of data from such register. That is, instead of accessing the contents of each register, the traditional interface accesses solely the data bits of the ESR. Alternatively, instead of accessing the entire contents of the ESR to identify each CFDC (and by extension, each ASIC system component) producing an error, the traditional interface accesses an output pin for limited information as to the existence of an error in any CFDC. For example, the ESR can indicate the existence of an error on a single output pin by providing the result of logically ORing each data bit in the register, where an error is represented by a binary "one" value. These approaches result in lowering the overhead penalty. However, such reduction is at the expense of accessing the MASK register and the DCR and of providing sufficient information to identify the components of the ASIC system in which errors are detected.

Offline testing using the traditional interface either incurs significant overhead penalty or, where such penalty is reduced by limiting access solely to the ESR or to limited information about the existence of an error from the ESR, results in insufficient testing of the assembly. Accordingly, there is a need to improve the interface used for offline testing of the maintenance register assembly in order to reduce the overhead penalty, while providing comprehensive testing of the assembly.

Another type of interface, other than the traditional interface, is known. This is the so-called Boundary Scan interface which his been used exclusively for offline testing of integrated circuit. The roots of the Boundary Scan interface are found in the scan test methodology developed in the 1960s. An example of one implementation of this technology is described in U.S. Pat. No. 3,582,902, granted Jun. 1, 1971. In addition, a standard Boundary Scan test architecture was approved by the American National Standards Institute (ANSI) and the Institute of Electrical and Electronics Engineers (IEEE) in 1990. IEEE Standard 1149.1-1990, *IEEE Standard Test Access Port and Boundary-Scan Architecture,* IEEE Standards Board, IEEE, Inc., 345 East 47th Street, New York, N.Y. 10017, USA, (1990). These publications are incorporated in their entirety herein by reference.

Historically, this standard architecture provided a means by which integrated circuits (ICs) may be designed according to the Boundary Scan standard such that their external connections may be tested using a four to six pin interface and implementation circuitry. Another application based on the standard also evolved. That is, the use of the Boundary Scan interface for offline testing of the ICs.

SUMMARY OF THE INVENTION

Our invention is directed to providing a Boundary Scan interface between the maintenance registers (which support the CFDCs) and the maintenance application of the ASIC system (in which the CFDCs and the maintenance registers are implemented) and/or of a remote maintenance application.

We have found that the Boundary Scan interface of the prior art has not heretofore been used to access maintenance register assemblies constructed according to our invention. In addition, we have found that the testing functions of the Boundary Scan interface applied to such assemblies, according to our invention, can expand the use of the interface from solely offline testing to online testing as well.

Accordingly, our invention implements the Boundary Scan interface as the interface to maintenance registers assemblies during offline testing and online testing. Offline testing operations of such an interface include monitoring and testing the maintenance register assembly and the CFDCs. The Boundary Scan interface has several advantages in contrast to the traditional system interface. Most importantly, the Boundary Scan interface requires the addition of six pins to the maintenance register assembly (as well as implementation circuitry) according to our invention in order to access the entire contents of each maintenance register in the assembly. In addition, only two of the pins are dedicated to the input and output of data for such maintenance registers. The standard Boundary Scan interface access is through a serial data-path so that the two pins access data along this serial data-path. The assembly according to our invention implements the serial data-path as follows: shadow registers are created for each of the ESR, the MASK register and the DCR. The shadow registers are shift registers containing the same configuration as their corresponding maintenance registers. The shift registers are also coupled in a daisy chain connection in order to form the serial data-path from a test input data line (from the Boundary Scan interface) to the maintenance register assembly, and through each of the shadow registers to a test data output line of the assembly. Also, additional hardware (i.e., three control pins and the test clock pin), implementation circuitry and test logic are added to the assembly to implement the Boundary Scan interface.

Accordingly, the pin count is drastically reduced from two input and output pins per bit of each register using the traditional system interface to a total of two input and output pins (as well as four pins for control signals) for the maintenance register assembly with the Boundary Scan interface. Similarly, using the Boundary Scan interface drastically reduces the area overhead for offline testing of the assembly. In addition, such drastic pin reduction is achieved while providing the Boundary Scan interface with access to the entire contents of each register so that comprehensive testing of the assembly is not comprised.

Another aspect of implementing the Boundary Scan interface according to our invention is the extension of such interface to online testing in addition to the primary use of such interface for offline testing. That is, the maintenance register assembly of our invention supports a combination of offline and online testing operations accessed by the Boundary Scan interface. For example, during offline testing, the Boundary Scan interface clears and forces errors in the maintenance registers by transmitting test data to the shift registers for subsequent transmission to their corresponding maintenance registers. Then, during online testing, the assembly processes the error data transmitted from the CFDCs. Fault recovery actions can then be initiated in the event that the interrupt circuits send an interrupt signal to the ASIC system's maintenance application to report an error based on the test data.

Accordingly, in addition to drastically reducing the area overhead for offline testing, the implementation of the Boundary Scan interface for the maintenance register assembly according to our invention also expands the use of the interface to online testing functions.

BRIEF DESCRIPTION OF THE DRAWINGS

The foregoing and other features and advantages of the present invention will be more readily apparent from the following detailed description when read in conjunction with the accompanying drawings, wherein:

FIG. 2 is the test logic of the maintenance register assembly which implements the Boundary Scan interface according to the illustrative embodiment of FIG. 1.

DESCRIPTION OF ILLUSTRATIVE EXEMPLARY EMBODIMENTS

Figure 1:
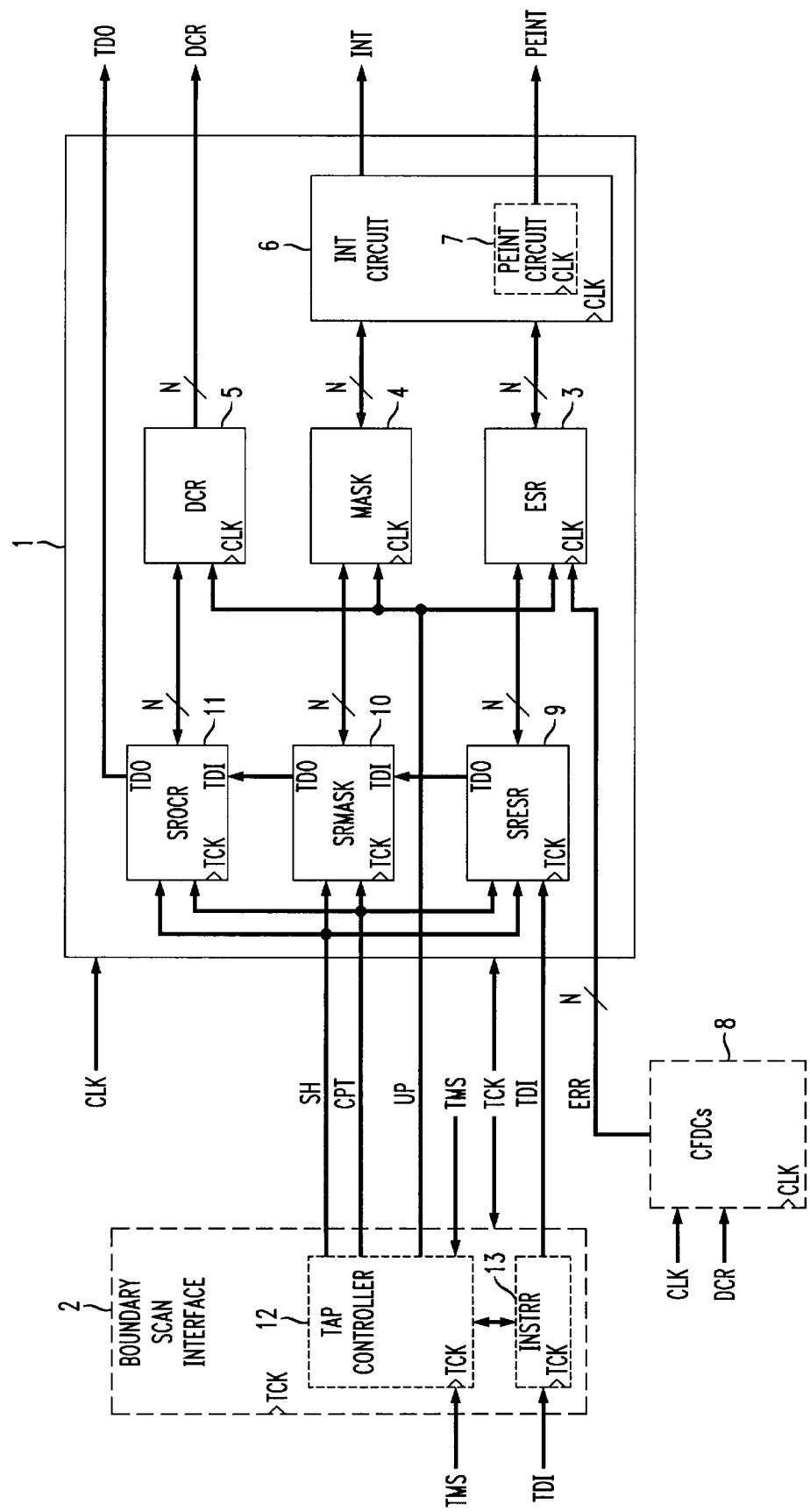
FIG. 1 is a block diagram of a maintenance register assembly, a Boundary Scan interface and a set of Concurrent Fault Detection Circuits according to an illustrative embodiment of the present invention.

Referring to FIG. 1, there is a shown a block diagram of a maintenance register assembly 1 accessed by a Boundary Scan interface 2 for an ASIC system (not shown) according to an illustrative embodiment of our invention. Assembly 1 includes devices typically used for online testing performed by the assembly 1 and devices added to the assembly in order to implement the Boundary Scan interface 2 for testing of the assembly 1 itself. In the illustrative embodiment, the components for the online testing performed by the assembly 1 comprise a series of maintenance registers, namely, an error source register (shown as ESR) 3 and a MASK register (shown as MASK) 4, an interrupt circuit (shown as INT circuit) 6 and a priority encoded interrupt circuit (shown as PEINT circuit) 7. The assembly 1 has a system clock line (shown as the CLK line) and an error line (shown as the ERR line) as inputs. Its outputs include an INT circuit line (shown as the INT line) and a PEINT circuit line (shown as the PEINT line). Also, Concurrent Fault Detection Circuits (CFDCs) 8, each of which provides a signal transmitted on the ERR input line to the assembly 1, have as inputs the CLK line and input lines (not shown) from the components which such CFDCs test (not shown). Also shown in the assembly 1 of FIG. 1 is a diagnostic control register (DCR) 5 and the output from such register 5, the DCR line, which is also an input to the CFDCs 8. The DCR 5 is used during offline testing to force errors in the CFDCs 8.

The testing functions performed by the assembly 1 during online testing are described first. Then, the testing of the assembly 1 itself, as accessed by the Boundary Scan interface 2 during offline and online testing, is described.

Referring again to FIG. 1, in the illustrative embodiment according to our invention, the ESR 3 is a register which processes error data from CFDCs 8 in order to identify the existence of one or more errors in component(s) of the ASIC system. The ESR 3 accomplishes this by latching and holding error data produced by the CFDCs 8.

Since the functionality of the ESR 3 is based on the CFDCs 8 it supports, reference is now made to the CFDCs 8. The general function of the each CFDC 8 is to test a predetermined component of the ASIC system in order to identify any errors in the operations of such component and provide the resulting error data to the ESR 3. There are various types of CFDCs 8 (not shown) which are well known in the art. Examples of the CFDCs 8 are a parity circuit, a cyclic redundancy check (CRC) circuit with default polynomial, a Hamming check circuit (with or without multiple error detection) and a checksum circuit. The check circuits are not illustrated in FIG. 1 because they are merely exemplary of the CFDCs 8 which can be used for our invention. The selection of particular CFDCs 8 for use in our invention is a matter of design preference based on the ASIC system in which the CFDCs 8 and maintenance registers 3, 4 and 5 are implemented. In addition, the CFDCs 8 identified above are well known in the art as to their operations and the signals for such operations, as shown in Chapters 3.5 and 4.9 of P. K. Lala, *Fault Tolerant and Fault Testable Hardware Design Systems*, Prentice Hall International (1985). Such Chapters 3.5 and 4.9 are incorporated in their entirety herein by reference. Accordingly, the CFDCs 8 will not be further described herein.

Moreover, our invention is not limited to the use of CFDCs 8 to provide data latched by the ESR 3. Rather, any device suitable for use in providing data to ESR 3 can be used in an embodiment of our invention. This is because the implementation of the Boundary Scan interface 2 is not dependent upon the source or processing which results in data stored in the ESR 3, but monitoring and testing the maintenance register assembly 1.

When the CFDC 8 detects an error in the component it tests, it produces an ERR signal having a binary one value. Similarly, when its component is fault-free, it produces an ERR signal having a binary zero value. The ERR signals from each of the CFDCs 8 are transmitted in parallel to the maintenance register assembly 1 via the ERR line (shown with a cross line to indicate that it includes parallel lines). The ERR input is transmitted to the ESR 3.

The ESR 3 contains an error data bit vector having a bit width N, where N is a generic integer equivalent to the number of CFDCs 8. Since each CFDC transmits its error data bit on a separate line of the ERR line, N is also equivalent to the number of lines of the ERR line (shown with a N to indicate that there are N lines). Each of the N bits of the ESR 3 correspond to a particular CFDC 8 and, by extension, to the representation of an error in a particular component of the ASIC system. In addition, the binary value designations which indicate an error or a fault-free status for the components tested by the CFDCs 8 are retained by the ESR 3. Accordingly, where the ESR 3 contains a binary zero value in a particular bit position, it represents that for the CFDC 8 corresponding to that bit position, the component of the ASIC system which that CFDC 8 tested is fault-free. Similarly, where a binary one value is held in the bit position, the corresponding system component contains an error. The ESR 3 holds the error data for processing by the assembly 1 and/or access by the Boundary Scan interface 2.

In the illustrative embodiment, the value of N is dependent on the number of CFDCs 8 implemented in the ASIC system and is a design parameter included in designing the assembly 1. In alternative embodiments, the value of N can be predetermined such that it cannot be provided by the designer, or it can be programmable such that it can be altered after the initial design and implementation of the CFDCs 8 and the assembly 1 (e.g., CFDCs can be added or changed during the use of the assembly 1, and the maintenance registers and shift registers can be designed to allow for active and inactive bit positions).

In addition, the MASK register 4 and the INT circuit 6, with or without the PEINT circuit 7, operate in conjunction with the ESR 3 to provide additional functionality to the maintenance register assembly 1 during online testing. They support the ESR 3 in reporting error data held by the ESR 3 to the maintenance operation of the ASIC system in order to initiate fault recovery actions when an error is detected. In addition, they support prioritizing reporting of the error data. For example, since some errors identified in particular components of the ASIC system may not be a high priority in the maintenance strategy of the system (e.g., such as parity errors when a given bit error rate is expected), certain non-critical errors can be eliminated or masked from reporting to the ASIC system. Another method used to process low priority errors, or errors that are expected to occur periodically, is to provide an error threshold function in the form of a rate counter such that errors are reported only after a certain number of errors have been detected or the error detection rate has exceeded some predefined specification.

The additional components which perform the priority functions include the MASK register 4, which performs the mask function or the elimination of error data latched by the ESR 3 so it not reported to the ASIC system. The MASK register 4 is also a register which is formed as a shadow register to the ESR 3. That is, it contains the same configuration as the ESR 3 with regard to the N bit width and bit positions. The function of the MASK register 4 is accomplished by storing a bit pattern which, when combined with the contents of the ESR 3 in a logical AND operation provided by the INT circuit 6 described in more detail below, eliminates an ESR 3 error data bit which indicates a low priority that is not to be reported by the assembly 1. The MASK register 4 bit pattern has the following binary value designations for masking or retaining errors: a binary value of zero means that the corresponding error data bit in the ESR 3 should be masked and a binary one value means that the corresponding error data bit in the ESR 3 should be retained. For example, to test the INT circuit 6, individual errors can be masked by writing a binary one value to the particular bit position of the MASK register 4 which corresponds to the bit position of the ESR 3 containing an error to be masked. The INT line can then be evaluated by the ASIC system maintenance application to ensure that the interrupt signal is not produced as an output from the circuit 6.

The INT circuit 6 is the means by which the ASIC system maintenance register assembly 1 interrupts the ASIC system in order to report one or more errors detected by the CFDCs 8 and held by the ESR 3. It generates an INT signal as an output from the assembly 1 on the INT line when it receives unmasked error data indicating a fault from the ESR 3. More particularly, the INT circuit 6 evaluates the error data bit vectors in the ESR 3 and the MASK register 4 and generates a binary one value as an INT signal to the ASIC system for reporting an error. There are two sets of inputs to the INT circuit 6, the error data bit vector from the ESR 3 and the bit vector as output from the MASK register 4. Both vectors are transmitted on parallel lines to the INT circuit 6. The bit vectors are logically ANDed by the INT circuit 6 such that, when an error is shown on the ESR 3 output based on a binary one value at a given bit position, where the binary value of the corresponding bit position in the MASK register 4 is one, the output of the logical AND operation is a binary one value. Hence, the INT circuit 6 outputs the INT signal having a binary one value and an interrupt of the ASIC system occurs. Similarly, where an error is shown for a given bit position of the bit vector from the ESR 3 output and the corresponding bit position of the MASK register 4 contains a binary zero value, the ESR 3 error data bit is masked such that the output of the INT circuit is a binary zero value and no interrupt of the ASIC system occurs. In addition, where the ESR 3 bit vector does not contain any binary zero values (i.e., there are no errors), the output from the INT circuit 6 will remain inactive (i.e., a binary zero value) regardless of whether the MASK register 4 contains mask or retain binary values.

Moreover, the INT circuit 6 can also implement the threshold function by determining the number of unmasked ESR 3 error data bits indicating an error and comparing it to a predetermined value. If the number of unmasked errors is greater than the predetermined value, then the INT circuit 6 outputs a binary one value on the INT line. Similarly, where the INT circuit 6 determines that the number of unmasked errors is fewer than the predetermined value, a binary zero value or no interrupt signal is provided. As a result, the INT circuit 6 can be implemented with sequential logic circuits and/or by software in a microprocessor.

In addition to the INT circuit 6, the PEINT circuit 7 provides the bit position of the active ESR 3 bit with the highest priority. The number of output bits driven by the PEINT circuit 7 can be specified by the designer of the maintenance register assembly 1 as the integer value M. In the illustrative embodiment, the PEINT circuit 7 is designed such that the most significant bit of the ESR 3 has the highest priority. For example, the ESR 3 bit in the 6th bit position has a higher priority than the ESR 3 bit in the 5th bit position, such that if both bits have a binary one value, the PEINT circuit would output the binary value of the 6th bit position, i.e., the bit pattern "110". When no bits from the ESR 3 have a binary one value, the PEINT circuit 7 produces the value for the ESR 3 bit position with the lowest priority (i.e., a bit pattern containing binary zero values). Therefore, the maintenance application can be designed to ignore this value of the PEINT circuit 7.

Moreover, the PEINT circuit 7 can be driven by the masked or unmasked ESR 3 error data as determined by the designer of the maintenance register assembly 1 by the generic integer value F. Where F equals zero, the input to the PEINT circuit 7 is driven by the output of the MASK register 4, and where F equals one, the input is driven by the output of the ESR 3. However, an ambiguity can arise where the PEINT circuit 7 is driven by the ESR 3 because an error can be masked as to the INT circuit 6, such that it is unclear whether the value at the output of the PEINT circuit 7 is based on an absence of errors indicating a fault in the ESR 3 or an error indicating a fault in the ESR 3 which is masked by the MASK register 4. To resolve this potential ambiguity, the PEINT circuit 7 can be designed so that the lowest priority bit position of the ESR 3 and MASK register 4 bits are designated as 1 rather than 0.

The maintenance registers 3, 4 and 5, the INT circuit 6, the PEINT Circuit 7 as well as the CFDCs 8 are run synchronously on the same clock domain, established by the clock signal CLK shown as an input line to the maintenance register assembly 1 and to each device 3 to 8.

The operations and the signals for such operations of the maintenance registers 3 and 4, the INT circuit 6 and the PEINT circuit 7 during online testing are well known in the art, as shown in Chapter 5 of B. W. Johnson, *Design and Analysis of Fault Tolerant Digital Systems,* Addison Wesley (1989) and Chapter 4.13 of P. K. Lala, *Fault Tolerant and Fault Testable Hardware Design Systems,* Prentice Hall International (1985). Such publications are incorporated in their entirety herein by reference. Reference is made to these publication for further description of such devices.

The Boundary Scan interface 2 monitors and performs the testing of the maintenance register assembly 1 and the CFDCs 8 during offline and online testing. The operations of the interface 2 are based on the two pin connections (for data input and output) between the interface 2 and the assembly 1. The standard Boundary Scan interface architecture mandates a serial data-path in such assembly 1. The serial data-path is provided by the shift registers 9, 10 and 11, namely, referring to FIG. 1, the shift register ESR (shown as the SRESR) 9, the shift register MASK (shown as the SRMASK) 10 and the shift register DCR (shown as the SRDCR) 11. The shift registers 9, 10 and 11 are shadow registers containing the same configuration as their corresponding maintenance registers 3, 4 and 5, with regard to the N bit width and bit positions. The shift registers 9, 10 and 11 communicate with their respective maintenance registers 3, 4 and 5 through N parallel lines, where each line corresponds to the same bit position for each register connected to that line. In addition, the shadow shift registers are coupled in a daisy chain to form a serial input-output path from the input of the maintenance register assembly 1, i.e., the test data input (TDI) line, to the output of the assembly 1, i.e., the test output line (TDO) line, such that the output of the SRESR 9 (which is also a TDO line) is coupled to the input of the SRMASK 10 (which is also a TDI line), and the output of the SRMASK 10 (also a TDO line) is coupled to the input of the SRDCR 11 (also a TDI line). This serial path of the shift registers 9, 10 and 11 meets the Boundary Scan interface 2 standard serial format.

In this way, data is communicated between the shift registers 9, 10 and 11 and the Boundary Scan interface 2 via a serial data-path. Data is further communicated between the shift registers 9, 10 and 11 and their corresponding maintenance registers 3, 4 and 5 via parallel transmission lines ((shown with a N and a cross line to indicate that it includes N parallel lines). This allows the Boundary Scan interface 2 to communicate data to and from the assembly 1 by the serial data-path of the shift registers 9, 10 and 11 and by the parallel lines between the shift registers 9, 10 and 11 and the maintenance registers 3, 4 and 5.

In the illustrative embodiment, during offline testing the primary function of the interface 2 is to read out the contents of the ESR 3 when the ASIC system's maintenance application receives an interrupt signal on the INT line from the INT circuit 6. The application triggers the Boundary Scan interface 2 to read the contents of the ESR 3 by transmitting the ESR 3 error data to the SRESR 9 and reading the contents of the SRESR 9. The interface 2 then transmits the ESR 3 contents to the maintenance application for the determination of whether and, if so, what fault recovery or resolution actions are to be taken. Where the maintenance application determines that fault recovery is not necessary, it can control the interface 2 to write test data to the MASK register 4 to mask the ESR 3 error data by transmitting a binary zero value to the appropriate bit position in the SRMASK 10 and further transmitting the contents of the SRMASK 10 to the MASK register 4. Where the maintenance application determines that resolution actions are to be taken, it can trigger the fault recovery software to take such action.

Another primary function of the Boundary Scan interface during offline testing is to force errors in the CFDCs 8. This operation uses the DCR 5 of the assembly 1. Like the MASK register 4, the DCR 5 is also formed as a shadow register to the ESR 3 with regard to the ESR 3 N bit width and bit positions. Accordingly, the DCR 5 configuration is consistent with the ESR 3 as to each bit position corresponding to particular CFDCs 8. The interface 2 transmits a bit vector to the DCR 5 through the SRDCR 11. The DCR 5 produces output signals on the DCR lines (containing N multiple lines for parallel transmission of the DCR 5 bit vector). The DCR 5 output is applied as inputs to the corresponding CFDCs 8 in order to force or clear errors in such CFDCs 8. The CFDCs 8 then operate based on the forced input from the DCR and provide the resulting error data to the ESR 3. The ESR 3 latches the error data, which can then be read by the interface 2 through transmission of the ESR 3 error data to the SRESR 9, and further transmission to the interface 2.

An additional primary operation of the interface 2 combines offline and online testing functions. Such an operation comprises clearing and forcing errors into the maintenance registers 3 and 4 by having the interface 2 transmit test data to the SRESR 9 and the SRMASK 10 for subsequent transmission to the ESR 3 and the MASK register 4, respectively. Then, during online testing, the assembly 1 processes the forced data as if it were error data transmitted to the ESR 3 on the ERR line. Offline testing by the interface 2 can then be initiated in the event that the INT circuit 6 sends an interrupt signal on the INT line to the ASIC system's maintenance application to report an error based on the test data. Accordingly, after forcing the test data to the maintenance registers 3 and 4, the interface 2 operates in the same manner as when error data indicating an error is transmitted on the ERR line to the ESR 3, that is, offline testing functions. This functionality of the interface 2 according to our invention combines offline and online testing.

These offline and online testing functions of the Boundary Scan interface 2 are exemplary of the operations supported by such interface 2. Additional operations can be executed using the particular functions available from the components of the assembly 1 and interface 2 used to implement the Boundary Scan interface 2. Referring once again to FIG. 1, the Boundary Scan interface 2 includes a TAP Controller 12 and an instruction register (shown as the INSTRR) 13. The inputs to the interface 2 include the TCK clock, discussed further below, and the TMS line. Its outputs include the SH line, the CPT line and the UP line. The maintenance register assembly 1 further includes: the six input and output pin connections, additional circuitry and test logic. The six input and output connections include: the TCK line, the SH line, the CPT line, the UP line and the TDI line as inputs; and as the TDO line as an output. The additional circuitry comprises the DCR 5 and the shift registers which correspond to the maintenance registers 3, 4 and 5, namely, the SRESR 9, the SRMASK 10 and the SRDCR 11, respectively. In addition, test logic (shown in FIG. 2) resides in the ESR 3 for the illustrative embodiments. It is a series of logical steps for implementing the interface 2.

The TAP Controller 12, the instruction register 13 and the software which controls them are part of the IEEE standard Boundary Scan interface 2 architecture. The TAP Controller 12 is a finite state machine for controlling the operation of the Boundary Scan interface 2 in response to a set of externally supplied signals, including a test mode select (TMS) signal (shown on the TMS line) and the TDI line. Additional signals dependent on the external source are not shown. The external source can be the ASIC system maintenance application including the CFDCs 8 and maintenance register assembly 1 and/or a remote maintenance application.

The signals on the TMS line are interpreted by the TAP Controller 12 in order for the Controller 12 to determine the mode to initiate. Based on the TMS signal, the TAP controller provides the following signals to the assembly 1 in order to implement such mode: the SH line, the CPT line and the UP line. When the TMS signal triggers the TAP Controller 12 to enter the "shift data register state", the TAP Controller 12 generates a binary one value on the SH line. Thereby, the Boundary Scan interface 2 enters a shift mode, during which it shifts test data serially via the TDI line into the shift registers 9, 10 and 11. When the TMS signal triggers the TAP Controller 12 to enter the "capture data register state", the TAP Controller 12 generates a binary one value on the CPT line. Thereby, the Boundary Scan interface 2 enters a capture mode, during which it captures error data from the maintenance registers 3, 4 and 5 into their respective shift registers 9, 10 and 11 via the parallel transmission paths between the shift registers 9, 10 and 11 and the maintenance registers 3, 4 and 5. When the TMS signal triggers the TAP Controller 12 to enter the "update data register state", the TAP Controller 12 generates a binary one value on the UP line. Thereby, the Boundary Scan interface 2 enters an update mode, during which it updates the maintenance registers 3, 4 and 5 with the test data stored in the shift registers 8, 9 and 10 via the parallel transmission paths between such devices.

The instruction register 13 is a shift register which receives test data and instruction codes (i.e., a bit vector) on the TDI line from the external source. The instruction register 13 is read by the TAP Controller 12, which determines whether the contents of the register 13 are test data for transmission to the assembly 1 or instruction codes for selection of the test to be performed by the interface 2 and the shift register 9, 10 and/or 11 (and by extension, the maintenance register 3, 4 and/or 5). The Controller 12 determines the status of the register 13 contents based on the value of the TMS signal on the TMS line. Where the TMS signal indicates that the Controller 12 should enter the shift mode, the data in the register 13 is test data for transmission to the assembly 1. Where the TMS signal indicates any other mode or other state for the Controller 12, the data in the register 13 is instruction code(s).

Reference is made to the IEEE Standard 1149.1-1990, *IEEE Standard Test Access Port and Boundary-Scan Architecture,* cited above for further a description of the features of the interface 2. In addition, these features and the inputs and outputs to the interface 2 are further described with reference to the assembly 1 components which implement the interface 2.

As mandated by the standard, the TCK is the clock used for operation of the Boundary Scan interface 2 and the testing of the maintenance register assembly 1 which it controls during offline testing and online testing functions, with the exception of the DCR 5 and an update mode of the interface 2. The DCR 5 operates on the system clock, namely the CLK, because the DCR output signals are transmitted to the CFDCs 8, which run on the CLK. Accordingly, to coordinate the transmission of data between the DCR 5 and the CFDCs 8, the DCR 5 operates on the same clock as the CFDCs 8. Whether operations run on the CLK are triggered on the rising or falling edge of such CLK can be a design parameter implemented by the test logic of the illustrative embodiment.

Operations in both of the shift and capture modes occur on the rising edge of the TCK as applied on the input TCK line to each of the shift registers 8, 9 and 10. However, the update mode is executed based on the rising or falling edge of the system clock on the CLK line (once again, defined as a design parameter). This is because error data (or actual errors identified by the CFDCs 8) in the ESR 3 takes precedence over the test data written by the interface 2. Therefore, where there is an actual error from a CFDC 8, it is latched by the ESR 3 rather than the test data from the interface 2 in the illustrative embodiment. The ESR 3 runs on the CLK. Accordingly, to coordinate the transmission of data between the SRESR 9 and the ESR 3 based on the data on ERR lines 8, the SRESR 9 runs on the same CLK as the ESR 3. Prior to executing the update mode operation, the ERR line is evaluated to determine whether there is error data indicating an error from the CFDCs 8. Where an error is indicated, it takes precedence over the test data from the interface 2 and is latched by the ESR 3. Where there is no error indicated, the test data is written to the ESR 3.

The TDI line to the assembly 1 transmits the test data from the interface 2 to the input of the SRESR 9 for shifting such test data into the shift registers 9, 10 and 11. Values presented at the TDI inputs to the shift registers 9, 10 and 11 are shifted into such registers on a rising edge of the TCK in the illustrative embodiment.

The TDO line transmits the test data from the maintenance register assembly 1 to an external source as it is shifted out of the shift registers 9, 10 and 11. For the shift registers 9, 10 and 11, the test data results from either TDI from the interface 2 or the data resulting from the capture mode implemented by the interface 2. Values presented at the TDO outputs from the shift registers 9, 10 and 11 are shifted out on the rising edge of the TCK in the illustrative embodiment.

Referring to FIG. 2, the maintenance register assembly 1 test logic executes the operations of the Boundary Scan interface 2. In the illustrative embodiment, the test logic is implemented in the ESR 3 and is driven by the SH, CPT and UP lines from the Controller 12. The test logic operates as follows: first it implements design parameters which may be defined by the user of the maintenance register assembly 1 or are programmable during the use of the assembly 1. Two variables are defined, namely the value of the integer N (as described above), and the rising or falling edge of the CLK for triggering operations of the assembly 1 devices 3 to 8.

In steps 1 to 3, the test logic initiates the maintenance registers, namely, the ESR 3, the MASK register 4 and the DCR 5 and establishes that they are triggered on the edge of the CLK as determined by the selected design parameter. Similarly, in steps 4 to 6, the test logic initiates the shadow registers, namely the SRESR 9, the SRMASK 10 and the SRDCR 11 and establishes that they are triggered on the rising edge of the TCK. In alternative embodiments according to our invention, the falling edge of the TCK can be used to trigger the shift registers, or the designation of the rising or falling edge can be a design parameter for selection in designing the assembly 1.

During step 7, the test logic processes the signals received on the SH, CPT and UP lines from the interface 2. In step 7A, when the SH line has a binary one value such that the interface 2 triggers the shift mode, the following series of sub-steps are executed on each rising edge of the TCK:

(1) For each of the SRESR 9, SRMASK 10 and SRDCR 11, the bit in the lowest priority bit position, namely the 1st bit location, is transmitted to the TDO line of each shift register 9, 10 and 11. The lowest priority bit position of 1, rather than 0, is used in the illustrative embodiment in order to avoid the ambiguity regarding the PEINT circuit 7 described above. The TDO lines for shift registers 9 and 10 are also the TDI line for shift registers 10 and 11, respectively;

(2) For the integer i having values from 1 to N−1, a loop is executed for each i value. During the loop, the bits are shifted from the highest priority bit position, namely the N bit location, to the lowest priority bit position of 1 in each shift register 9, 10 and 11. The shift operation occurs on an incremental basis of one bit location per shift, as shown for example, by the shift operation for the SRESR 9, where the bit position of the bit to be shifted is i+1 and the bit position to receive the shifted bit is i; and (3) Once the loop for the i values from 1 to N−1 have been completed, the bit on the TDI line of each shift register 9, 10 and 11 is shifted into the N bit location of registers 9, 10 and 11. At the end of this loop, the bits in the SRESR 9, the SRMASK 10 and the SRDCR 11 are shifted by one bit position to the right.

In step 7B, when the CPT line has a binary one value such that the interface 2 triggers the capture mode, the capture mode is executed using the parallel transmission lines between the shift registers 9, 10 and 11 and their corresponding maintenance registers 3, 4 and 5. On the rising edge of the TCK, the error data bit vector stored in the maintenance registers 3, 4 and 5 is transmitted to the identical bit positions of the shift registers 9, 10 and 11.

In step 7C, when the UP line has a binary one value such that the interface 2 triggers the update mode, the update mode is executed using the parallel transmission lines between the shift registers 9, 10 and 11 and their corresponding maintenance registers 3, 4 and 5. However, the update mode operation is controlled by the CLK in order for the ERR line to the ESR 3 to be checked for error data indicating an error before the ESR 3 receives the test data from the interface 2. Where there are no errors identified by the CFDCs 8, the update mode operation is executed.

These hardware and software features of the assembly 1 are designed in order to comply with the IEEE standard as mandated for use of the Boundary Scan interface 2, as set forth in the IEEE Standard 1149.1-1990, *IEEE Standard Test Access Port and Boundary-Scan Architecture,* cited above. Reference is also made to the information provided in such publication for further description.

In alternative embodiments according to this invention, a smaller or larger number of maintenance registers and/or interrupt circuits presently known or hereinafter identified to provide the functionality described as to the maintenance registers of our invention may be used. This results in a significant number of combinations of maintenance register assemblies which, based on the functionality of each register, provides a significant number of functional combinations. The following are examples of maintenance register assemblies 1 (combinations of maintenance registers and interrupt circuits are indicated by an "*" between such devices and, for ease of description, the references shown in FIG. 1 are used): ESR*INT; ESR*INT*PEINT; ESR*MASK*INT; ESR*MASK*INT*PEINT; ESR*MASK*INT*DCR; ESR*MASK*INT*PEINT*DCR; ESR*INT*DCR; and, ESR*INT*PEINT*DCR.

Accordingly, this invention does not require any one combination and is not limited to the maintenance registers and interrupt circuit described herein. Rather, our invention is directed to the Boundary Scan interface 2 between any number, combination and type of maintenance registers which provide error data from a given circuit (e.g., CFDCs 8) according to the particular design of a system in which the maintenance register assembly is implemented. The selection of the maintenance register assembly is a matter of design preference as long as the proper assembly functionality is preserved. Regardless of the assembly 1 designed, the Boundary Scan interface 2 monitors and tests the operations provided by such assembly 1. In addition, our invention can also be applied to devices which implement system control functions in ASIC systems, for example, system control registers. Such devices also store data based on the operations of system components and accordingly, can be tested during online and offline testing.

In addition, in alternative embodiments, the particular design of inputs and outputs as to the maintenance register assembly 1 (e.g., a single versus parallel lines between the CFDC 8 check circuits and the ESR 3) is a matter of design preference and does not limit our invention. Furthermore, in alternative embodiments, the values of the binary signals and the designation of the rising edge of the TCK to trigger interface 2 operations, described as to the illustrative embodiment, can be modified. So long as the functionality of the maintenance register assembly 1 is maintained, our invention is not limited to the particular binary value designations described as to the illustrative embodiment.

What is claimed is:

1. A network for providing an interface between a maintenance register assembly and a maintenance application, wherein the maintenance application detects errors in a main system and said maintenance register assembly, the main system includes a plurality of components for performing the operations of the main system and a plurality of testing circuits, and each of the testing circuits acts to test a separate one of the components and produce an error status bit stream to indicate whether the component has an error, said network comprising:

a plurality of maintenance registers in said maintenance register assembly, each of said maintenance registers receiving and storing error status bits from one of the testing circuits;

a plurality of shadow registers in said maintenance register assembly, each of said shadow registers including a shift register and being coupled to a respective one of said maintenance registers and coupled to another of said shadow registers in a daisy chain and each of said shadow registers receiving said error status bits from one of said respective maintenance registers, and a last one of said shadow registers in said daisy chain having a serial output line coupled to the maintenance application; and a Boundary Scan interface including a test data output line coupled as an input to a first of said shadow registers and controlling shifting of an error status bit stream through said shadow registers in said daisy chain to said serial output line in order to communicate said error status bit stream to the maintenance application, said error bit stream providing an error status signal for each of the components to the maintenance application.

2. The network in accordance with claim 1 further comprising:

said at least one maintenance register having a plurality of maintenance register bit locations, each of said maintenance register bit locations corresponds to one of said error status bits from a separate one of the testing circuits; and said at least one shadow register having a bit width equal to that of said at least one maintenance register and receiving said error status bits from said at least one maintenance register in a plurality of shadow register bit locations corresponding to said maintenance register bit locations.

3. The network in accordance with claim 2 wherein at least two of said plurality of maintenance registers are error source registers.

4. The network in accordance with claim 2 wherein said plurality of maintenance registers includes at least one error source register, at least one mask register and at least one diagnostic control register.

5. The network in accordance with claim 1 wherein said at least one maintenance register is an error source register.

6. The network in accordance with claim 1 wherein said error status bits comprise a concatenation of each error status bit from the testing circuits.

7. The network in accordance with claim 1 wherein the maintenance application is in the main system.

8. The network in accordance with claim 1 wherein the maintenance application is in a separate system from the main system.

9. The network in accordance with claim 1 wherein the maintenance application is an automatic test generator.

10. An apparatus for providing an interface between a maintenance register assembly and a maintenance application, wherein the maintenance application detects errors in a main system and said maintenance register assembly, the main system includes a plurality of components for performing the operations of the main system and a plurality of testing circuits, and each of the testing circuits acts to test a separate one of the components and produce an error status bit to indicate whether the component has an error, said apparatus comprising:

a plurality of maintenance registers in said maintenance register assembly, each of said maintenance registers having a plurality of maintenance register bit locations and each of said maintenance register bit locations corresponding to one of the testing circuits, each of said maintenance registers receiving and storing error status bits from one of the testing circuits in separate ones of said plurality of maintenance register bit locations;

a plurality of shadow registers in said maintenance register assembly, each of said shadow registers including a shift register and being coupled to a respective one of said maintenance registers and coupled to another of said shadow registers in a daisy chain;

a Boundary Scan interface including a test data output line coupled as an input to a first of said shadow registers and an input line of said maintenance application being coupled to a serial output line of a last of said shadow registers, said Boundary Scan interface controlling shifting of a plurality of test bits into said shadow registers so that said test bits are serially shifted in said shadow registers in said daisy chain in order for said shadow registers to send said test bits to said maintenance registers, said test bits including at least one test bit indicating an error.

11. The apparatus of claim 10 further comprising:

an interrupt circuit in communication with said at least one maintenance register, said at least one maintenance register sending said error status bits to said interrupt circuit in order for said interrupt circuit to send said error status bits to the maintenance application when said interrupt circuit identifies an error in said error status bits; and said interrupt circuit sending said test bits received from said at least one maintenance register to the maintenance application based on said at least one test bit indicating an error in order for the maintenance application to determine whether said at least one maintenance register accurately received said test bit indicating said error.

12. The apparatus in accordance with claim 10 wherein said plurality of maintenance registers include at least one error source register and at least one mask register.

13. The apparatus of claim 12 wherein:

said test bits having a plurality of test bits indicating a plurality of errors;

said mask register having a bit width equal to said error source register and receiving said test bits from said shadow register corresponding to said mask register; and said interrupt circuit further including a priority encoded interrupt circuit, said priority encoded interrupt circuit receiving said test bits from said error source register and said mask register for reporting said plurality of errors based on the values of said test bits in said mask register.

14. The apparatus in accordance with claim 10 wherein said at least one maintenance register is an error source register.

15. The apparatus in accordance with claim 10 wherein said error status bits comprise a concatenation of each error status bit from the testing circuits.

16. The apparatus in accordance with claim 10 wherein the maintenance application is in the main system.

17. The apparatus in accordance with claim 10 wherein the maintenance application is in a separate system from the main system.

18. The apparatus in accordance with claim 10 wherein the maintenance application is an automatic test generator.

19. The apparatus in accordance with claim 10 wherein at least two of said plurality of maintenance registers are error source registers.

20. The apparatus in accordance with claim 10 wherein said plurality of maintenance registers are at least one error source register, at least one mask register and at least one diagnostic control register.

21. A method of transferring error status data from testing circuits associated with components in a main system by means of an interface which has fewer connections than twice the number of the testing circuits, said method comprising the steps of:

transferring a plurality of error status bits from said testing circuits into an error source register;

transferring said error status bits from said error source register into a shadow register during on-line testing; and serially reading out said error status bits from said shadow register based on a Boundary Scan interface shifting said error status bits through said shadow register in order to provide said error status bits to a maintenance application which detects errors in the main system and the error source register.

* * * * *